United States Patent
Kim et al.

(10) Patent No.: US 7,508,245 B2
(45) Date of Patent: Mar. 24, 2009

(54) LOCK DETECTOR AND DELAY-LOCKED LOOP HAVING THE SAME

(75) Inventors: Doh-Young Kim, Seoul (KR); Phil-Jae Jeon, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 130 days.

(21) Appl. No.: 11/495,277

(22) Filed: Jul. 28, 2006

(65) Prior Publication Data

US 2007/0035337 A1 Feb. 15, 2007

(30) Foreign Application Priority Data

Aug. 10, 2005 (KR) .................... 10-2005-0073211

(51) Int. Cl.
*H03L 7/06* (2006.01)
(52) U.S. Cl. .................. 327/158; 327/147; 327/149; 327/156; 327/161
(58) Field of Classification Search .............. 327/2, 327/7, 9, 12, 24, 25, 27, 147, 149, 156, 158, 327/161

See application file for complete search history.

(56) References Cited

U.S. PATENT DOCUMENTS

| | | | | |
|---|---|---|---|---|
| 4,232,393 A * | 11/1980 | Kumaoka et al. | ......... | 455/154.1 |
| 4,414,517 A * | 11/1983 | Mahig | ......... | 333/167 |
| 4,527,080 A * | 7/1985 | Zweig | ......... | 327/12 |
| 4,872,155 A * | 10/1989 | Yokogawa et al. | ....... | 369/47.28 |
| 5,256,989 A * | 10/1993 | Parker et al. | ......... | 331/1 A |
| 5,359,635 A * | 10/1994 | Atriss et al. | ......... | 377/39 |
| 5,530,383 A * | 6/1996 | May | ......... | 327/39 |
| 5,784,122 A * | 7/1998 | Nayebi et al. | ......... | 348/549 |
| 5,870,002 A * | 2/1999 | Ghaderi et al. | ......... | 331/17 |
| 5,955,902 A * | 9/1999 | Takada et al. | ......... | 327/116 |
| 5,969,576 A * | 10/1999 | Trodden | ......... | 331/1 A |
| 6,133,769 A * | 10/2000 | Fontana et al. | ......... | 327/156 |
| 6,259,290 B1 * | 7/2001 | Takada et al. | ......... | 327/158 |
| 6,496,554 B1 * | 12/2002 | Ahn | ......... | 375/376 |
| 6,614,317 B2 * | 9/2003 | Wong et al. | ......... | 331/17 |
| 6,667,643 B2 * | 12/2003 | Ko | ......... | 327/158 |
| 6,670,834 B1 * | 12/2003 | Swanson | ......... | 327/156 |
| 6,734,739 B2 * | 5/2004 | Kawahara | ......... | 331/25 |
| 6,747,518 B1 * | 6/2004 | Chung | ......... | 331/1 A |
| 6,777,991 B2 * | 8/2004 | Murakami | ......... | 327/156 |
| 6,844,761 B2 * | 1/2005 | Byun et al. | ......... | 327/149 |
| 6,870,415 B2 * | 3/2005 | Zhang et al. | ......... | 327/274 |

(Continued)

FOREIGN PATENT DOCUMENTS

JP 2000-022524 1/2000

(Continued)

*Primary Examiner*—Kenneth B Wells
*Assistant Examiner*—Adam Houston
(74) *Attorney, Agent, or Firm*—Mills & Onello, LLP

(57) ABSTRACT

A lock detector of a delay-locked loop (DLL) includes a lock detection unit and a bias unit. The lock detection unit generates a charge control signal based on a reference current received from an external source and a plurality of delay signals received from an external voltage-controlled delay line (VCDL), controls a charge current based on the charge control signal, and detects a lock state of the DLL based on a voltage that varies depending on the charge current. The bias unit provides a bias voltage for controlling a magnitude of the charge current. Therefore, the lock detector stably detects a lock state of the DLL.

46 Claims, 11 Drawing Sheets

U.S. PATENT DOCUMENTS

| | | | | |
|---|---|---|---|---|
| 6,963,234 B2* | 11/2005 | Bidenbach | ............. | 327/158 |
| 6,990,165 B2* | 1/2006 | Boerstler et al. | ............. | 375/376 |
| 7,015,725 B1* | 3/2006 | Yu et al. | ............. | 327/12 |
| 7,027,548 B1* | 4/2006 | Palusa et al. | ............. | 375/375 |
| 7,034,723 B2* | 4/2006 | Suda et al. | ............. | 341/122 |
| 7,042,260 B2* | 5/2006 | Choi | ............. | 327/156 |
| 7,057,428 B2* | 6/2006 | Jung | ............. | 327/149 |
| 7,073,098 B2* | 7/2006 | Kozaki | ............. | 714/700 |
| 7,084,682 B2* | 8/2006 | Jeon et al. | ............. | 327/158 |
| 7,099,244 B2* | 8/2006 | Nakata et al. | ............. | 369/47.19 |
| 7,126,400 B2* | 10/2006 | Tamura | ............. | 327/261 |
| 7,199,626 B2* | 4/2007 | Yu et al. | ............. | 327/156 |
| 7,233,182 B1* | 6/2007 | Savoj | ............. | 327/141 |
| 7,239,188 B1* | 7/2007 | Xu et al. | ............. | 327/156 |
| 7,271,621 B2* | 9/2007 | Metz | ............. | 327/3 |
| 7,336,112 B1* | 2/2008 | Sha et al. | ............. | 327/158 |
| 2003/0001634 A1* | 1/2003 | Cao et al. | ............. | 327/158 |
| 2004/0000937 A1* | 1/2004 | Byun et al. | ............. | 327/158 |
| 2004/0008063 A1* | 1/2004 | Kim et al. | ............. | 327/158 |
| 2005/0073343 A1* | 4/2005 | Kim et al. | ............. | 327/156 |
| 2005/0093598 A1* | 5/2005 | Jeon et al. | ............. | 327/158 |
| 2006/0132205 A1* | 6/2006 | Wu et al. | ............. | 327/158 |
| 2006/0279438 A1* | 12/2006 | Kishi et al. | ............. | 341/51 |
| 2006/0284656 A1* | 12/2006 | Yu et al. | ............. | 327/156 |
| 2007/0195637 A1* | 8/2007 | Lin | ............. | 365/233 |

FOREIGN PATENT DOCUMENTS

| | | |
|---|---|---|
| JP | 2001-257587 | 9/2001 |
| KR | 1020000013403 A | 3/2000 |
| KR | 10-2003-0027507 | 4/2003 |
| KR | 10-2005-0041730 | 5/2005 |

* cited by examiner

| X Y | XNOR(FILTER_IN) | XOR(UNLOCK) |
|---|---|---|
| 0 0 | 1 | 0 |
| 0 1 | 0 | 1 |
| 1 0 | 0 | 1 |
| 1 1 | 1 | 0 |

LOCK DETECTOR AND DELAY-LOCKED LOOP HAVING THE SAME

CROSS-REFERENCE TO RELATED APPLICATIONS

This application claims priority to Korean Patent Application No. 10-2005-0073211 filed on Aug. 10, 2005 in the Korean Intellectual Property Office (KIPO), the entire contents of which are herein incorporated by reference.

BACKGROUND OF THE INVENTION

1. Field of the Invention

The present invention relates to a lock detector and a delay-locked loop having the same, and more particularly to a lock detector and a delay-locked loop having the same for detecting a stable lock state by using analog charging and discharging operations based on a plurality of delay signals.

2. Description of the Related Art

A delay-locked loop (DLL) is a device for generating an internal clock signal that is locked to an external clock signal received from an external source.

The DLL may be a single phase or multiphase clock generator similar to a phase-locked loop (PLL), and is widely used in areas such as communication or control systems in which clock recovery, frequency synthesis, signal modulation, signal demodulation, and so on, are required.

For example, the DLL is frequently used in a cache memory device, which is typically implemented with a static random-access memory (SRAM) for improving data processing speeds between a central processing unit (CPU) and a dynamic random-access memory (DRAM). In addition, the DLL is frequently used in various kinds of logic circuits, synchronous DRAM (SDRAM), Rambus DRAM, etc.

The DLL includes, in general, a delay block for delaying a reference signal and a control block for controlling the delay block such that an output signal of the delay block is locked to the reference signal by comparing the reference signal (i.e., an input signal) with the feedback signal (i.e., the output signal).

In an initial operation time of the DLL, the reference signal and the feedback signal are not synchronized, that is, the DLL is in an unstable state. The feedback signal (i.e., the output signal) is stably locked to the reference signal after a predetermined time. This state is referred to as a lock state, which means that the output signal is stabilized with respect to the input signal.

When the lock state of the DLL is incorrectly determined, the reliability of the DLL and a device using an output of the DLL may be decreased. Therefore, it is important to determine exactly whether or not the DLL is in the lock state.

As a result, a lock detector for determining the lock state of the DLL is required to enhance the reliability of the DLL and other related devices.

A conventional lock detector uses a digital logic type lock detector similar to a lock detector of the PLL, which is described in Korean Patent Laid-Open Publication Nos. 2003-27507 and 2005-41730.

The digital lock detector includes a plurality of logic components such as an AND gate, a NAND gate and so on, in order to form a digital logic for detecting the lock state of the DLL. However, the digital logic may be influenced by variations in environmental conditions such as process, voltage, and temperature (PVT). Thus the logic components included in the DLL may generate noise that causes a malfunction of the DLL.

For example, although an output signal has not been fully stabilized, the digital lock detector may determine that the output signal is locked. In addition, the digital lock detector may not determine whether or not the DLL is in the lock state when a state of the output signal varies due to an abnormal input signal. Therefore, the above problems degrade the reliability of the DLL that requires an accurate operation.

In addition, use of many logic components may increase size of the DLL, thereby degrading an integration degree of an entire chip that includes the DLL and increasing an amount of power for driving the circuit.

SUMMARY OF THE INVENTION

Accordingly, the present invention is provided to substantially obviate one or more problems due to limitations and disadvantages of the related art.

Some embodiments of the present invention provide a lock detector capable of stably detecting a lock state of a delay-locked loop (DLL).

Other embodiments of the present invention provide a DLL capable of stably detecting a lock state of an output signal of the DLL.

According to one aspect, the present invention is directed to a lock detector of a DLL. The lock detector includes a lock detection unit configured to generate a charge control signal based on a reference current received from an external source and a plurality of delay signals received from an external voltage-controlled delay line (VCDL), configured to control a charge current based on the charge control signal, and configured to detect a lock state of the DLL based on a voltage that varies depending on the charge current, the charge current including first and second currents; and a bias unit configured to provide a bias voltage for controlling a magnitude of the charge current.

The delay signals can include a first delay signal, a second delay signal, a third delay signal, a fourth delay signal, a fifth delay signal, a sixth delay signal and a seventh delay signal, in which the delay signals are sequentially outputted from seven unit delay cells of the VCDL, respectively.

The lock detection unit can include a charge unit configured to provide the voltage that varies depending on the charge current; a charge control signal generation unit configured to generate the charge control signal based on the reference signal and the third delay signal; a charge control unit configured to generate the first current for charging the charge unit by a unit time, in response to the charge control signal generated by the charge control signal generation unit; a discharge unit configured to generate the second current for discharging the charge unit by the unit time, in response to the charge control signal generated by the charge control signal generation unit; and a lock preparation signal output unit configured to output a lock preparation signal when the lock state is detected.

In further embodiments, the charge control signal generation unit can include an exclusive-NOR (XNOR) gate that receives the reference signal and the third delay signal. The charge control signal can be at a high level when logic levels of the reference signal and the third delay signal are identical, and the charge control signal is at a low level when the logic levels of the reference signal and the third delay signal are different.

In one embodiment, the charge control unit and the discharge control unit are coupled in series between a power voltage and a ground terminal, and the charge control unit is coupled in parallel to a lock decision node, in which the lock decision node is a linkage point between the charge control unit and the discharge control unit.

The charge control unit can include a charge control metal-oxide semiconductor (MOS) transistor coupled to the power voltage, and configured to be turned on in response to the inverted charge control signal; and a first bias MOS transistor coupled in series between the charge control MOS transistor and the lock decision node, and configured to generate the first current based on the bias voltage provided by the bias unit.

In addition, the discharge control unit may include a discharge control MOS transistor coupled to the ground terminal, and configured to be turned on in response to the charge control signal; and a second bias MOS transistor coupled in series between the discharge control MOS transistor and the lock decision node, and configured to generate the second current based on the bias voltage provided by the bias unit. Magnitudes of the first current and the second current can be substantially the same.

in one embodiment, the unit time is a time interval between the two adjacent delay signals. In case of the seven delay signals, the unit time is about one-seventh of a period of the reference signal. The charge unit can include a capacitor.

in one embodiment, the lock preparation signal output unit outputs the lock preparation signal when a voltage of the lock decision node is increased by the charge current up to a lock voltage. The lock preparation output unit can be a Schmitt trigger circuit that is insensitive to noise.

In further embodiments, the lock detection unit further includes an unlock signal generation unit configured to generate an unlock signal based on the reference signal and the seventh delay signal; and an unlock control unit coupled in parallel to the lock decision node, and configured to generate a third current for discharging the charge unit by the unit time, in response to the unlock signal generated by the unlock signal generation unit.

in one embodiment, the unlock signal is at a low level when logic levels of the reference signal and the seventh delay signal are identical, and the unlock signal is at a high level when the logic levels of the reference signal and the seventh delay signal are different. That is, the unlock signal generation unit can be implemented with an exclusive-OR (XOR) gate that receives the reference signal and the seventh delay signal. in one embodiment, a magnitude of the third current is about seven times that of the first current.

In one embodiment, the unlock control unit includes an unlock control MOS transistor coupled to the ground terminal, and configured to be turned on in response to the unlock signal; and a third bias MOS transistor coupled in series between the lock decision node and the unlock control MOS transistor, and configured to generate the third current for discharging the charge unit based on the bias voltage provided by the bias unit.

In further embodiments, the lock detector further includes a lock signal output unit configured to be activated in response to a lock preparation signal provided from the lock detection unit, configured to determine whether or not the reference signal is abnormal based on the reference signal and at least one of the delay signals, and configured to output a lock signal when the reference signal is normal, the lock signal indicating that the DLL is in the lock state. For example, the lock signal output unit determines whether or not the reference signal is abnormal based on the reference signal and the fifth delay signal.

The lock signal output unit can include a first inverter configured to invert the fifth delay signal; a first D flip-flop configured to be activated when a reset of the first D flip-flop is cleared by the lock preparation signal outputted from the lock detection unit, and configured to lock the reference signal to a first clock signal to output the locked reference signal, the first clock signal being an output signal of the first inverter; a second D flip-flop configured to be activated when a reset of the second D flip-flop is cleared by the lock preparation signal, and configured to lock the reference signal to a second clock signal to output the locked reference signal, the second clock signal being the fifth delay signal; a second inverter configured to invert an output signal of the second D flip-flop; a NAND gate configured to receive an output signal of the first D flip-flop and an output signal of the second inverter to perform a NAND operation on the output signal of the first D flip-flop and the output of the second inverter; and a third inverter configured to invert an output signal of the NAND gate to output the lock signal.

According to another aspect, the present invention is directed to a DLL that includes a phase detector configured to compare a reference signal with a feedback signal to generate an up signal or a down signal, the reference signal corresponding to an input signal provided from an external source, the feedback signal corresponding to an output signal of the DLL; a charge pump configured to generate a current signal that varies based on the up signal and the down signal outputted from the phase detector; a loop filter configured to generate a control voltage signal; a voltage-controlled delay line (VCDL) configured to delay the reference signal in response to the control voltage signal outputted from the loop filter, the VCDL having a plurality of unit delay cells that are coupled in series and sequentially generate delay signals; and a lock detector configured to detect a lock state of an output signal from the VCDL based on the reference signal and the delay signals outputted from the VCDL.

In further embodiments, the delay signals comprise a first delay signal, a second delay signal, a third delay signal, a fourth delay signal, a fifth delay signal, a sixth delay signal and a seventh delay signal, and each of the delay signals is sequentially outputted from respective seven unit delay cells of the VCDL. In additional embodiments, the lock detection unit includes the charge unit; a charge control signal generation unit configured to generate a charge control signal by using the reference signal and the third delay signal; a charge control unit configured to charge a current to about as much as a first current to the charge unit by a unit time, in response to the charge control signal generated by the charge control signal generation unit; a discharge unit configured to discharge a current to about as much as a second current from the charge unit by the unit time, in response to the charge control signal generated by the charge control signal generation unit; and a lock preparation signal output unit configured to output a lock preparation signal when the lock state is detected by a current charged to the charge unit.

In further embodiments, the charge control unit includes a charge control MOS transistor configured to be turned on by the inverted charge control signal, the charge control MOS transistor being coupled to the power voltage; and a first bias MOS transistor configured to form the first current for providing the bias unit as a bias source to the charge unit, the first bias MOS transistor being coupled in series between the charge control MOS transistor and the lock decision node. In further embodiments, the discharge control unit includes a discharge control MOS transistor configured to be turned on by the charge control signal, the discharge control MOS transistor being coupled to the ground terminal; and a second bias MOS transistor configured to form the second current for providing the bias unit as a bias source to the charge unit, the second bias MOS transistor being coupled in series between the discharge control MOS transistor and the lock decision node.

In one embodiment, the lock detector comprises: a lock detection unit configured to generate a charge control signal based on the reference signal and the delay signals, configured to control a charge current based on the charge control signal, and configured to detect a lock state of the DLL based on a voltage that varies depending on the charge current, the charge current including first and second currents; and a bias unit configured to provide a bias voltage for controlling a magnitude of the charge current.

In one embodiment, the VCDL comprises a first unit delay cell, a second unit delay cell, a third unit delay cell, a fourth unit delay cell, a fifth unit delay cell, a sixth unit delay cell and a seventh unit delay cell, the first through seventh unit delay cells being coupled in series. In one embodiment, the lock detection unit receives a first delay signal outputted from the first unit delay cell, a second delay signal outputted from the second unit delay cell, a third delay signal outputted from the third unit delay cell, a fourth delay signal outputted from the fourth unit delay cell, a fifth delay signal outputted from the fifth unit delay cell, a sixth delay signal outputted from the sixth unit delay cell and a seventh delay signal outputted from the seventh unit delay cell. In one embodiment, the lock detection unit comprises: a charge unit configured to provide the voltage that varies depending on the charge current; a charge control signal generation unit configured to generate the charge control signal based on the reference signal and the third delay signal; a charge control unit configured to generate the first current for charging the charge unit by a unit time, in response to the charge control signal generated by the charge control signal generation unit; a discharge unit configured to generate the second current for discharging the charge unit by the unit time, in response to the charge control signal generated by the charge control signal generation unit; and a lock preparation signal output unit configured to output a lock preparation signal when the lock state is detected. In one embodiment, the charge control signal generation unit includes an exclusive-NOR (XNOR) gate that receives the reference signal and the third delay signal. In one embodiment, the charge control signal is a high level when logic levels of the reference signal and the third delay signal are identical, and the charge control signal is a low level when the logic levels of the reference signal and the third delay signal are different. In one embodiment, the charge control unit and the discharge control unit are coupled in series between a power voltage and a ground terminal, and the charge control unit is coupled in parallel to a lock decision node, the lock decision node being a linkage point between the charge control unit and the discharge control unit. In one embodiment, the charge control unit comprises: a charge control metal-oxide semiconductor (MOS) transistor coupled to the power voltage, and configured to be turned on in response to the inverted charge control signal; and a first bias MOS transistor coupled in series between the charge control MOS transistor and the lock decision node, and configured to generate the first current based on the bias voltage provided by the bias unit. In one embodiment, the discharge control unit comprises: a discharge control MOS transistor coupled to the ground terminal, and configured to be turned on in response to the charge control signal; and a second bias MOS transistor coupled in series between the discharge control MOS transistor and the lock decision node, and configured to generate the second current based on the bias voltage provided by the bias unit.

In one embodiment, magnitudes of the first current and the second current are substantially the same.

In one embodiment, the unit time is a time interval between the two adjacent delay signals. In one embodiment, the unit time is about one-seventh of a period of the reference signal.

In one embodiment, the charge unit includes a capacitor.

In one embodiment, the lock preparation signal output unit outputs the lock preparation signal when a voltage of the lock decision node is increased by the charge current up to a lock voltage.

In one embodiment, the lock preparation output unit is a Schmitt trigger circuit that is insensitive to noise.

In one embodiment, the lock detection unit comprises: an unlock signal generation unit configured to generate an unlock signal based on the reference signal and the seventh delay signal; and an unlock control unit coupled in parallel to the lock decision node, and configured to generate a third current for discharging the charge unit by the unit time, in response to the unlock signal generated by the unlock signal generation unit. In one embodiment, the unlock signal is a low level when logic levels of the reference signal and the seventh delay signal are identical, and the unlock signal is a high level when the logic levels of the reference signal and the seventh delay signal are different. In one embodiment, the unlock signal generation unit includes an exclusive-OR (XOR) gate that receives the reference signal and the seventh delay signal. In one embodiment, a magnitude of the third current is about seven times that of the first current. In one embodiment, the unlock control unit comprises: an unlock control MOS transistor coupled to the ground terminal, and configured to be turned on in response to the unlock signal; and a third bias MOS transistor coupled in series between the lock decision node and the unlock control MOS transistor, and configured to generate the third current for discharging the charge unit based on the bias voltage provided by the bias unit.

In one embodiment, the lock detector further comprises: a lock signal output unit configured to be activated in response to a lock preparation signal provided from the lock detection unit, configured to determine whether or not the reference signal is abnormal based on the reference signal and at least one of the delay signals, and configured to output a lock signal when the reference signal is normal, the lock signal indicating that the DLL is in the lock state. In one embodiment, the lock signal output unit determines whether or not the reference signal is abnormal based on the reference signal and the fifth delay signal. In one embodiment, the lock signal output unit comprises: a first inverter configured to invert the fifth delay signal; a first D flip-flop configured to be activated when a reset of the first D flip-flop is cleared by the lock preparation signal outputted from the lock detection unit, and configured to lock the reference signal to a first clock signal to output the locked reference signal, the first clock signal being an output signal of the first inverter; a second D flip-flop configured to be activated when a reset of the second D flip-flop is cleared by the lock preparation signal, and configured to lock the reference signal to a second clock signal to output the locked reference signal, the second clock signal being the fifth delay signal; a second inverter configured to invert an output signal of the second D flip-flop; a NAND gate configured to receive an output signal of the first D flip-flop and an output signal of the second inverter to perform a NAND operation on the output signal of the first D flip-flop and the output of the second inverter; and a third inverter configured to invert an output signal of the NAND gate to output the lock signal.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE EMBODIMENTS

Figure 1:
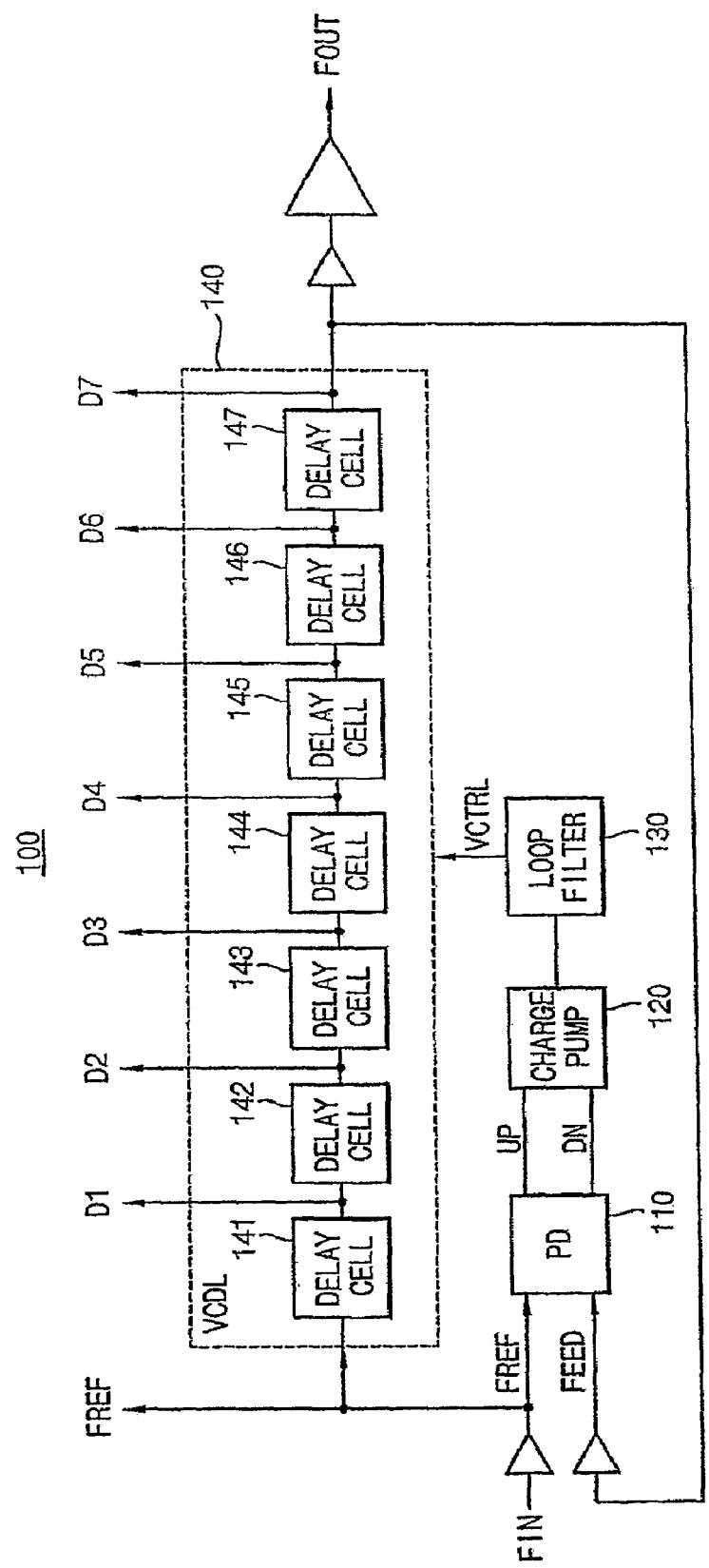
FIG. 1 is a block diagram illustrating a configuration of a conventional delay-locked loop (DLL).

Detailed illustrative example embodiments of the present invention are described herein. However, specific structural and functional details described herein are merely representative for purposes of describing example embodiments of the present invention. This invention may, however, be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms described, but on the contrary, the invention is to cover all modifications, equivalents, and alternatives falling within the spirit and scope of the invention.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element; without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.)

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention now will be described more fully hereinafter with reference to the accompanying figures, in which embodiments of the invention are shown. FIG. 1 is a block diagram illustrating a configuration of a delay-locked loop (DLL).

Referring to FIG. 1, the DLL 100 includes a phase detector (PD) 110, a charge pump 120, a loop filter 130 and a voltage-controlled delay line (VCDL) 140.

The PD 110 compares a reference signal FREF (that is, a buffered signal of an input signal FIN received from an external source) with a feedback signal FEED to generate an up signal UP or a down signal DOWN. The up signal UP and the down signal DOWN are provided to the charge pump 120.

The charge pump 120 receives the up signal UP or the down signal DOWN from the PD 110 and generates a current signal that varies based on the up signal UP and the down signal DOWN. The current signal is provided to the loop filter 130.

The loop filter 130 receives the current signal from the charge pump 120 and performs filtering of the received current signal to generate a control voltage signal VCTRL. The generated control voltage signal VCTRL is applied to the VCDL 140.

The VCDL 140 receives the reference signal FREF and delays the reference signal FREF by a predetermined time in response to the control voltage signal VCTRL that is applied from the loop filter 130. The signal delayed by the VCDL 140 is an output signal FOUT, and the output signal FOUT is provided to the PD 110 as the feedback signal FEED.

The VCDL 140 includes a plurality of delay cells 141 through 147 that are coupled in series. The delay cells 141 through 147 include, for example, seven delay cells such as a first delay cell 141, a second delay cell 142, a third delay cell 143, a fourth delay cell 144, a fifth delay cell 145, a sixth delay cell 146 and a seventh delay cell 147.

An output signal of the first delay cell 141 is defined as a first delay signal D1, an output signal of the second delay cell 142 is defined as a second delay signal D2, an output signal of the third delay cell 143 is defined as a third delay signal D3, an output signal of the fourth delay cell 144 is defined as a fourth delay signal D4, an output signal of the fifth delay cell 145 is defined as a fifth delay signal D5, an output signal of the sixth delay cell 146 is defined as a sixth delay signal D6, and an output signal of the seventh delay cell 147 is defined as a seventh delay signal D7.

Figure 2:
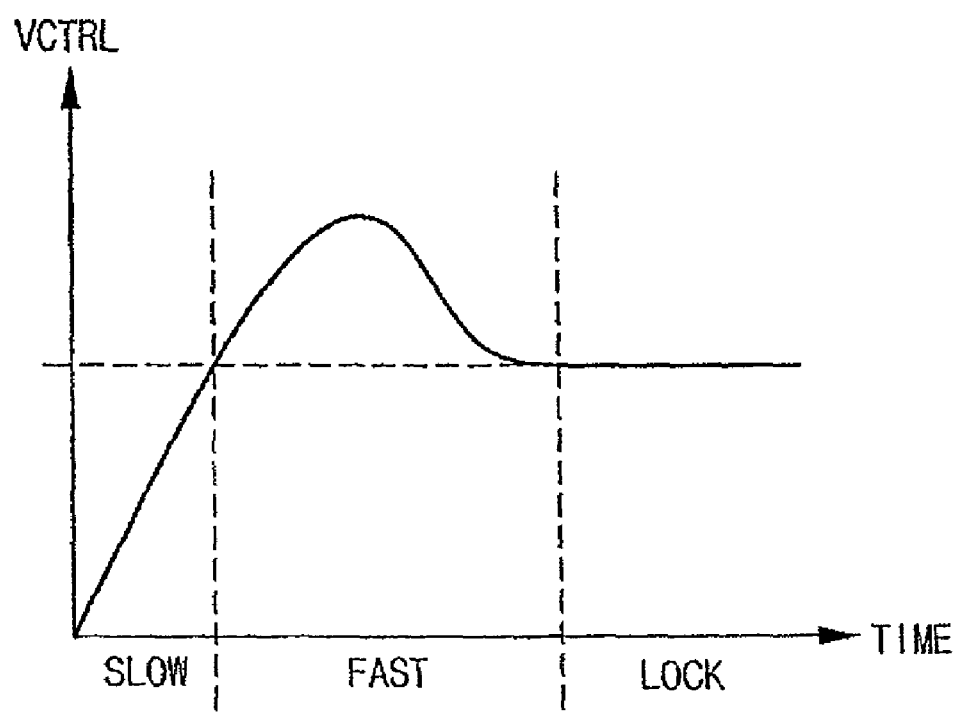
FIG. 2 is a graph illustrating a variation of the control voltage signal of the DLL in FIG. 1.

FIG. 2 is a graph illustrating a variation of the control voltage signal VCTRL of the DLL 100 in FIG. 1.

Referring to FIG. 2, the control voltage signal VCTRL is classified into three states, that is, a slow state in an initial operation time, a fast state in a middle operation time, and a lock state in a stable operation time.

Figure 3:
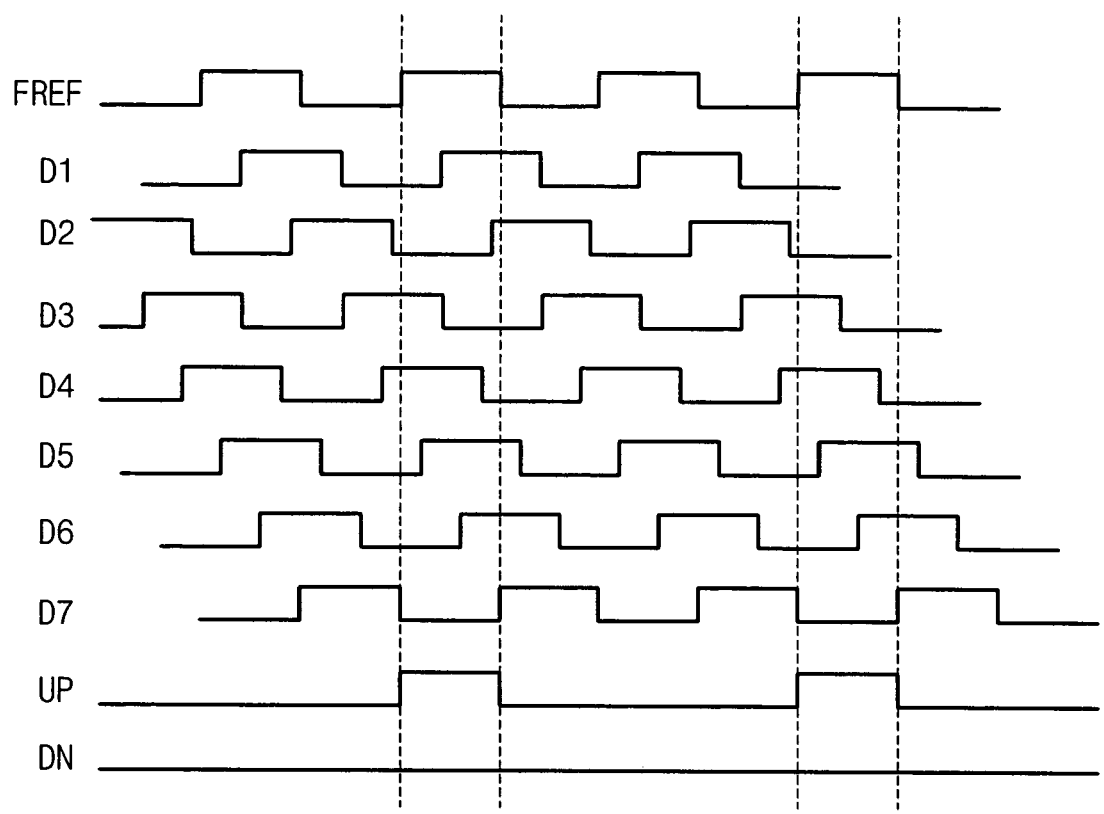
FIG. 3 is a timing diagram illustrating a signal flow in a slow state.
Figure 4:
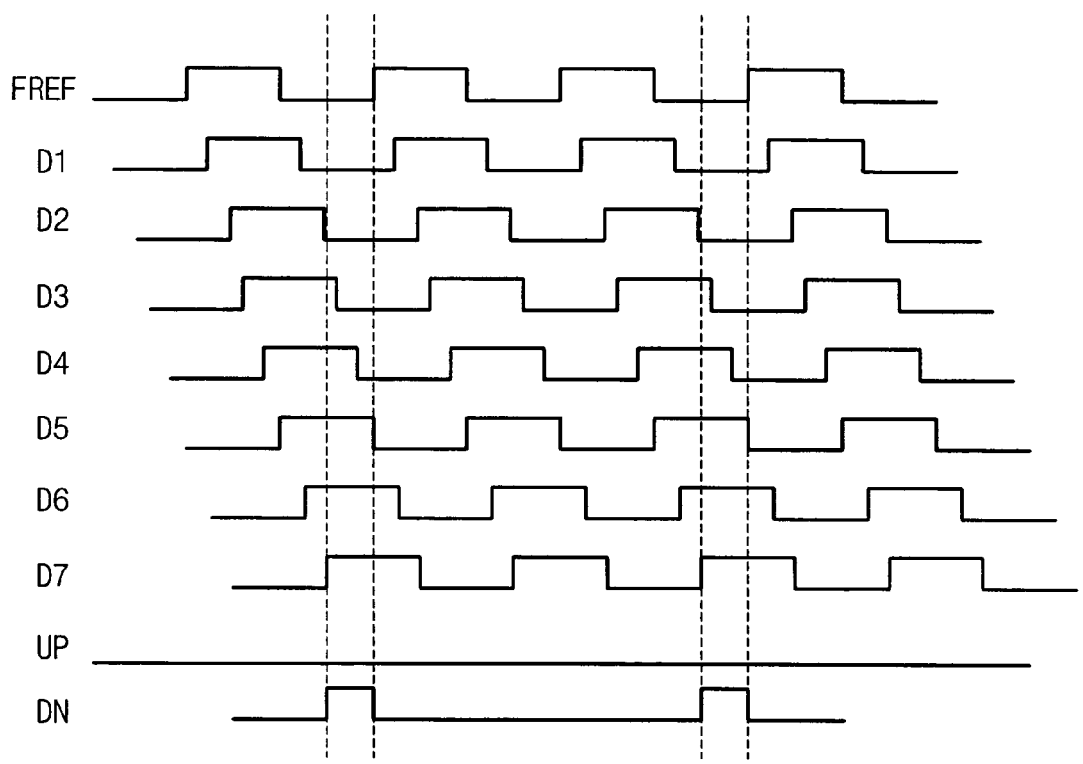
FIG. 4 is a timing diagram illustrating a signal flow in a fast state.
Figure 5:
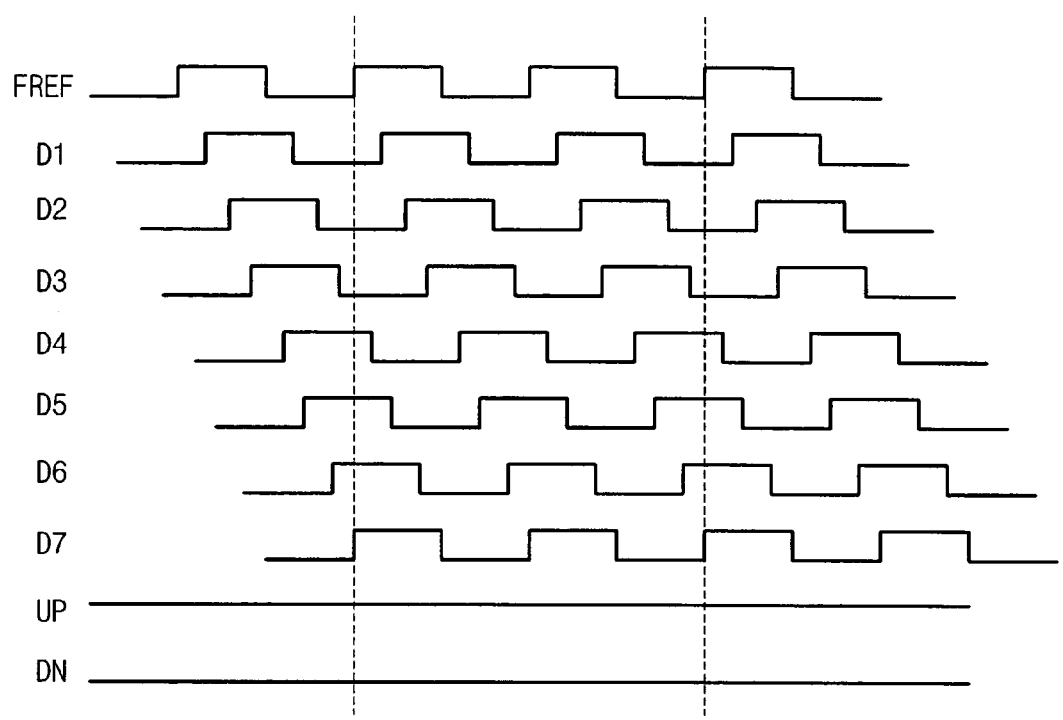
FIG. 5 is a timing diagram illustrating a signal flow in a lock state.

FIGS. 3 through 5 are timing diagrams illustrating signal flows in the three states of FIG. 2. FIG. 3 is a timing diagram illustrating a signal flow in the slow state, FIG. 4 is a timing diagram illustrating a signal flow in the fast state, and FIG. 5 is a timing diagram illustrating a signal flow in the lock state.

Referring to FIG. 3, the PD 110 outputs an up signal UP since the seventh delay signal D7 (that is, an output of the VCDL 140) is slower than the reference signal FREF in the slow state.

Referring to FIG. 4, the PD 110 outputs a down signal DN since the seventh delay signal D7 (that is, an output of the VCDL 140) is faster than the reference signal FREF in the fast state.

Referring to FIG. 5, both the up signal UP and the down signal DN have a low level since the seventh delay signal D7 (that is, an output of the VCDL 140) is locked to the reference signal FREF in the lock state.

Figure 6:
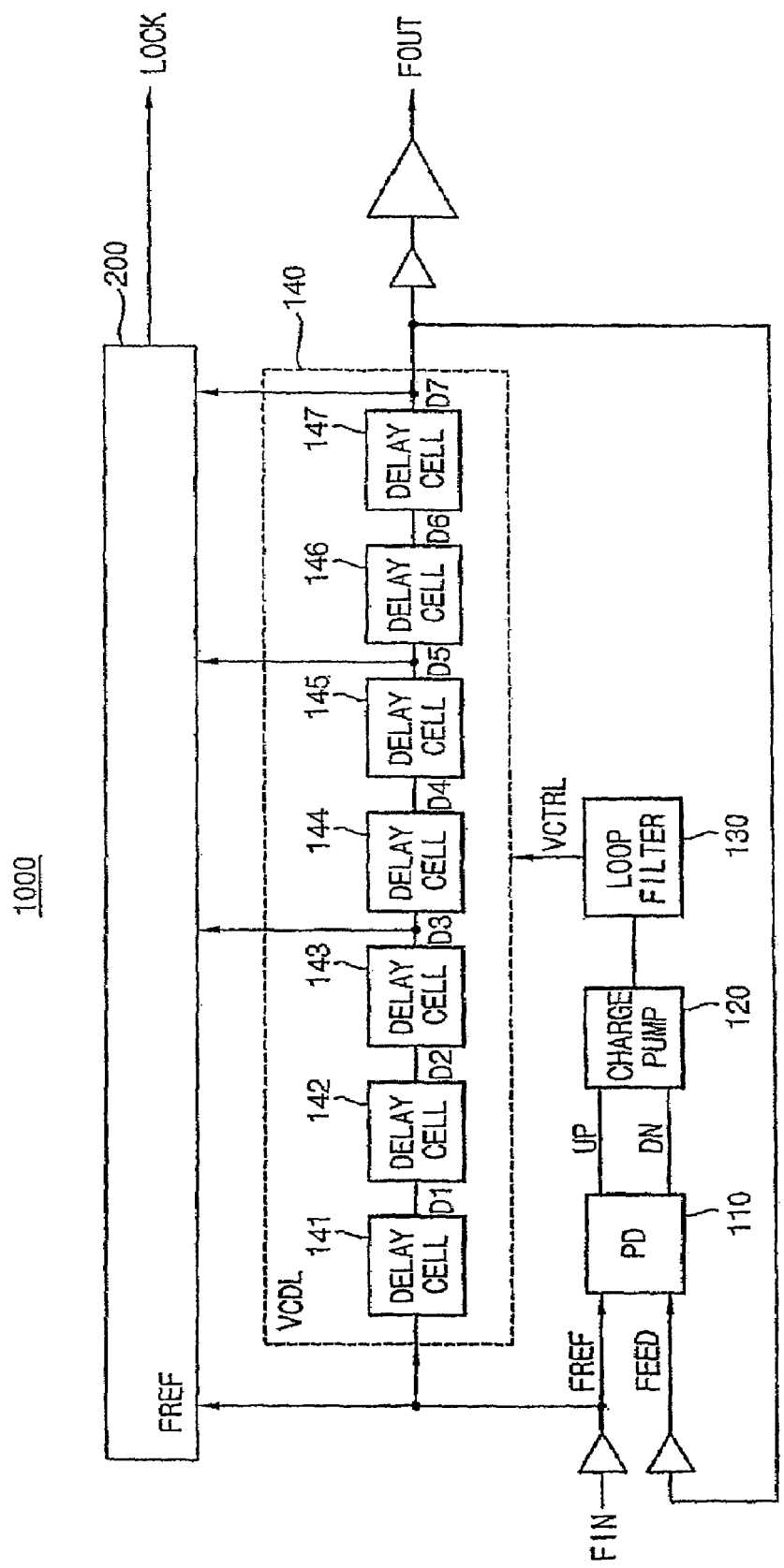
FIG. 6 is a block diagram illustrating a DLL including a lock detector according to an example embodiment of the present invention.

FIG. 6 is a block diagram illustrating a configuration of a DLL 1000 including a lock detector according to an example embodiment of the present invention.

Referring to FIG. 6, the lock detector 200 receives the reference signal FREF (that is, a buffered signal of an input signal FIN received from an external source) and one or more delay signals D3, D5, and D7 of delay signals D1 through D7. The delay signals D1 through D7 are respectively outputted from the delay cells 141 through 147 of the VCDL 140, and are respectively referred to as the first delay signal D1, the second delay signal D2, the third delay signal D3, the fourth delay signal D4, the fifth delay signal D5, the sixth delay signal D6 and the seventh delay signal D7. The lock detector 200 generates a lock signal LOCK for indicating a lock state of the DLL based on the reference signal FREF and the one or more delay signals D3, D5, and D7.

Figure 7:
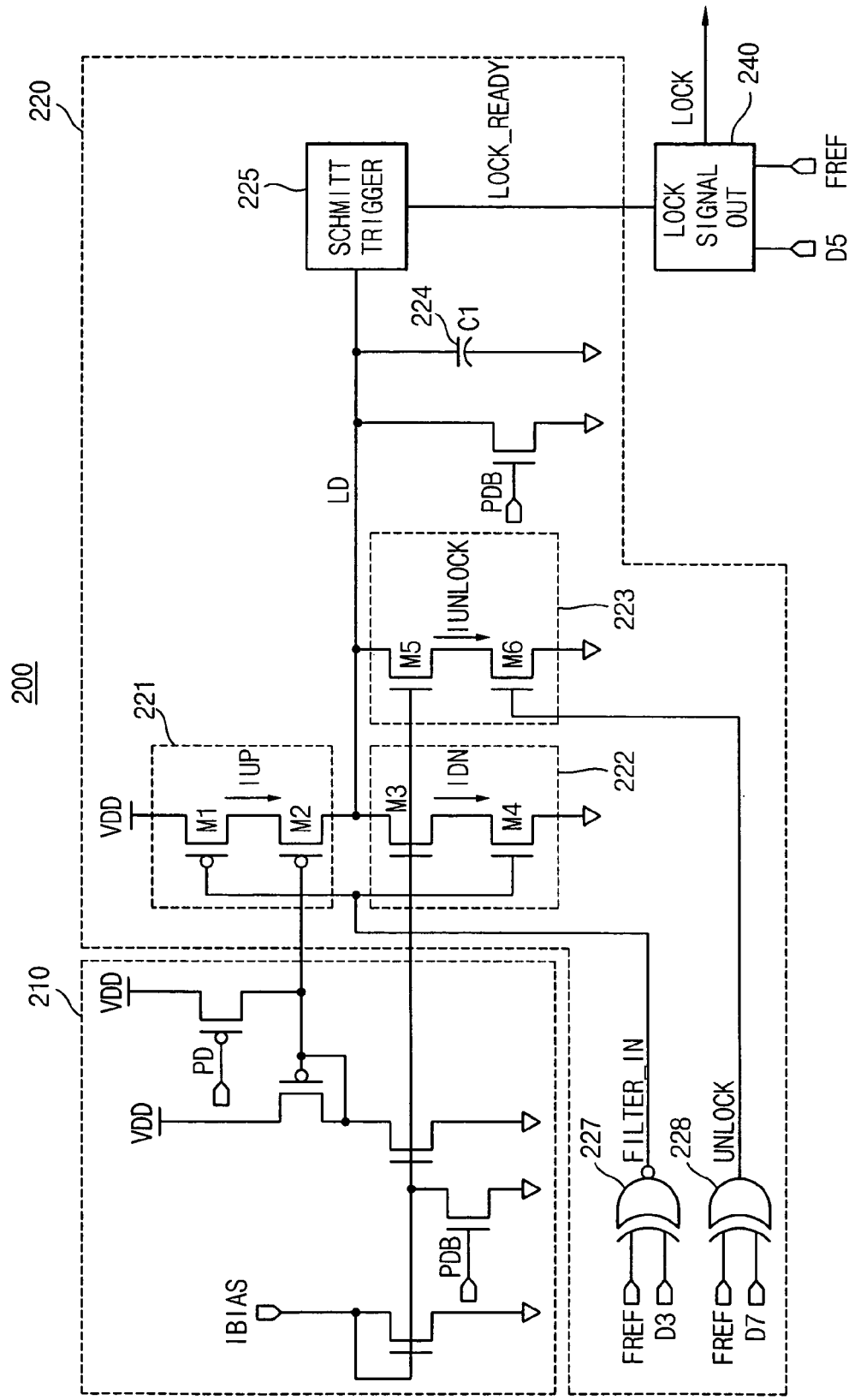
FIG. 7 is a circuit diagram illustrating a configuration of the lock detector in FIG. 6 according to an example embodiment of the present invention.

FIG. 7 is a circuit diagram illustrating a configuration of the lock detector 200 in FIG. 6 according to an example embodiment of the present invention.

Referring to FIG. 7, the lock detector 200 includes a bias unit 210, a lock detection unit 220 and a lock signal output unit 240.

The bias unit 210 receives a power voltage VDD applied from an external source and a current IBIAS, which is insensitive to environmental conditions such as process, voltage, and temperature (PVT) and is generated from a reference bias circuit (not shown), to provide a bias voltage for the lock detector 220. The lock detector 220 generates a charge current IUP, a discharge current IDN and an unlock current IUNLOCK based on the bias voltage provided from the bias unit 210.

The lock detector 220 includes a charge control signal generation unit 227, a charge control unit 221, a discharge control unit 222, an unlock signal generation unit 228, an unlock control unit 223, a charge unit 224 and lock preparation signal output unit 225.

The charge control signal generation unit 227 receives the reference signal FREF and the third delay signal D3 to generate a charge control signal FILTER_IN. The charge control signal generation unit 227 includes an exclusive-NOR (XNOR) gate performing an XNOR operation on the reference signal FREF and the third delay signal D3 to output the charge control signal FILTER_IN.

Therefore, the charge control signal FILTER_IN outputted from the charge control signal generation unit 227 has a high level when the logic levels of the reference signal FREF and the third delay signal D3 are identical, and a low level when the logic levels of the reference signal FREF and the third delay signal D3 are different.

The charge control unit 221 and the discharge control unit 222 are coupled in series between a power voltage VDD and a ground terminal. A node between the charge control unit 221 and the discharge control unit 222 is referred to as a lock decision node LD. The charge unit 224 and the unlock control unit 223 are respectively coupled to the lock decision node LD, in parallel to each other.

The charge control unit 221 provides a first current (i.e., the charge current) IUP to the charge unit 224 by a unit time TD, in response to the charge control signal FILTER_IN generated by the charge control signal generation unit 227.

The unit time TD is a time interval between the respective delay signals D1 through D7. Because there are seven delay signals D1 through D7 according to an example embodiment of the present invention, the unit time TD is about one-seventh of a period of the reference signal FREF.

The charge control unit 221 includes a charge control metal-oxide semiconductor (MOS) transistor M1 and a first bias MOS transistor M2. The charge control MOS transistor M1 is coupled to a power voltage VDD and is turned on in response to an inverse signal of the charge control signal FILTER_IN. The first bias MOS transistor M2, which is coupled in series between the charge control MOS transistor M1 and the lock decision node LD, generates the first current IUP for charging the charge unit 224. The first bias MOS transistor M2 receives the bias voltage to a gate thereof from the bias unit 210.

The discharge control unit 222 provides a second current (i.e., the discharge current) IDN to the charge unit 224 by the unit time TD, in response to the charge control signal FILTER_IN generated by the charge control signal generation unit 227. A magnitude of the second current IDN is substantially the same as that of the first current IUP.

The discharge control unit 222 includes a discharge control MOS transistor M4 and a second bias MOS transistor M3. The discharge control MOS transistor M4 is coupled to a ground terminal and is turned on in response to the charge control signal FILTER_IN. The second bias MOS transistor M3, which is coupled in series between the discharge control MOS transistor M4 and the lock decision node LD, generates the second current IDN for discharging the charge unit 224. The second bias MOS transistor M3 receives the bias voltage to a gate thereof from the bias unit 210.

The unlock signal generation unit 228 receives the reference signal FREF and the seventh delay signal D7 to generate an unlock signal UNLOCK. The unlock signal generation unit 228 includes an exclusive-OR (XOR) gate performing an XOR operation on the reference signal FREF and the seventh delay signal D7 to output the unlock signal UNLOCK.

Therefore, the unlock signal UNLOCK outputted from the unlock signal generation unit 228 has a low level when the logic levels of the reference signal FREF and the seventh delay signal D7 are identical, and a high level when the logic levels of the reference signal FREF and the seventh delay signal D7 are different.

The unlock control unit 223 is coupled to the lock decision node LD and provides a third current IUNLOCK for discharging the charge unit 224, in response to the unlock signal UNLOCK generated by the unlock signal generation unit 228. The third current IUNLOCK is about seven times the magnitude of the first current IUP or the second current IDN.

The unlock control unit 223 includes an unlock control MOS transistor M6 and a third bias MOS transistor M5. The unlock control MOS transistor M6 is coupled to a ground terminal and is turned on in response to the unlock signal UNLOCK. The third bias MOS transistor M5, which is coupled in series between the lock decision node LD and the unlock control MOS transistor M6, generates the third current IUNLOCK for discharging the charge unit 224. The third bias MOS transistor M5 receives the bias voltage to a gate thereof from the bias unit 210.

The charge unit 224 is coupled to the lock decision node LD and is charged by the first current IUP that is provided from the charge unit 224 by the unit time TD. A charge stored in the charge unit 224 is discharged by the second current IDN that is provided by the discharge control unit 222. Additionally, the charge stored in the charge unit 224 is discharged by the third current IUNLOCK that is provided by the unlock control unit 223. The charge unit 224 may include a charge capacitor C1 that is coupled to the lock decision node LD.

The lock preparation signal output unit 225 outputs a lock preparation signal LOCK_READY when a voltage of the lock decision node LD is increased up to a lock voltage, that is, a high input voltage (HIV), by a current for charging the charge unit 224. The lock voltage is about 2.5 V. The lock preparation signal output unit 225 may be implemented with a Schmitt trigger that is insensitive to noise.

As described above, the lock detector 220 generates the lock preparation signal LOCK_READY when an output of the DLL 1000 is increased up to a lock state. However, according to the characteristics of the DLL 1000, the VCDL 140 only delays the reference signal FREF, that is, the buffered input signal FIN. Therefore, the lock detector 220 to includes a circuit, which may detect an abnormal input so that the lock detector 200 outputs an inactivated signal (for example, a low level) when the control circuit of a preceding stage stops providing a control signal or the input signal FIN is stopped due to an abnormal operation. Therefore, the lock signal output unit 240 is provided as a function block that detects an abnormality of the input signal FIN.

The lock signal output unit 240 operates in response to the lock preparation signal LOCK_READY outputted from the lock preparation signal output 225. The lock signal output unit 240 receives the reference signal FREF and the fifth delay signal D5 and determines whether the reference signal FREF (that is, the input signal FIN) is abnormal. The lock signal output unit 240 outputs a lock signal LOCK only when an abnormality of the input signal FIN is not found.

Figure 8:
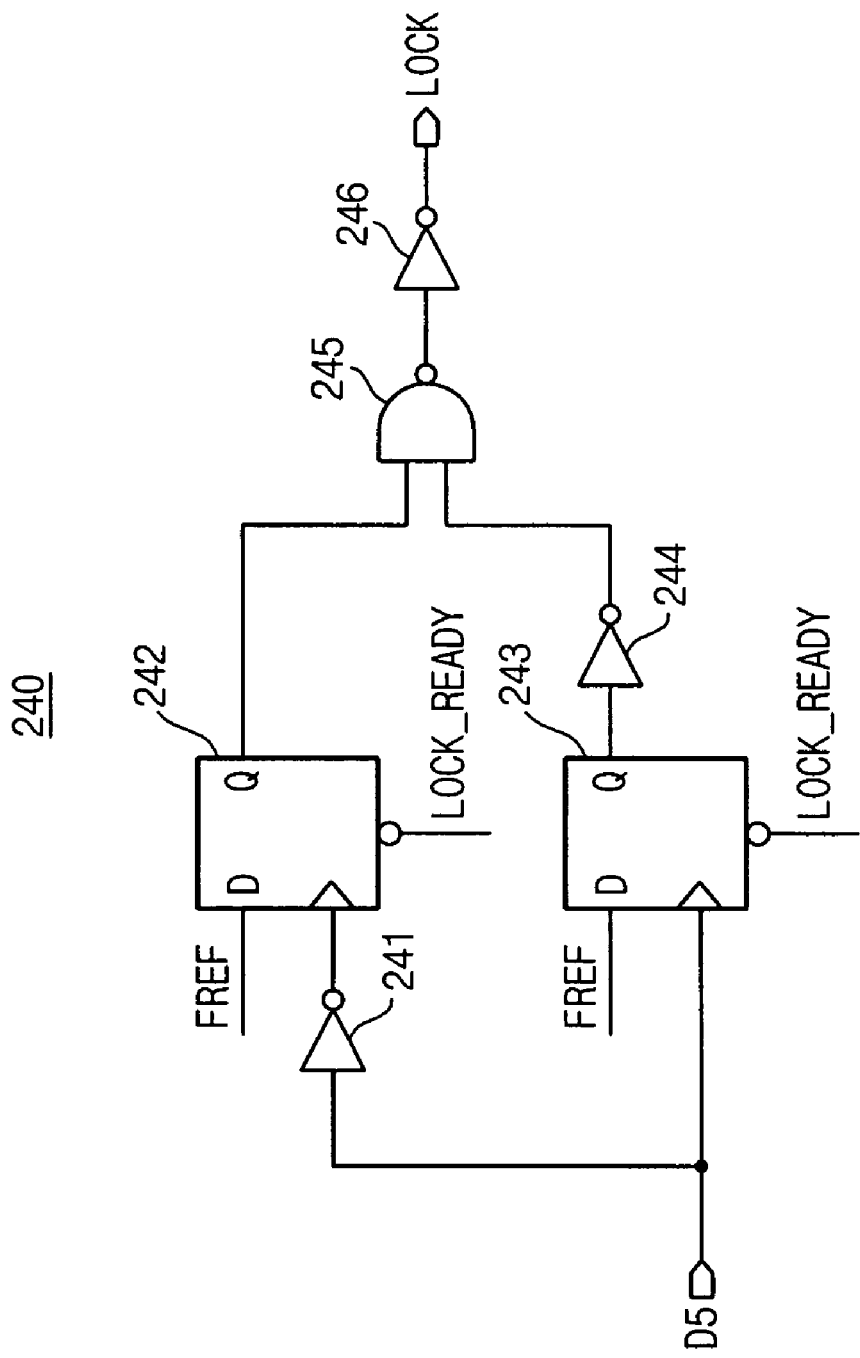
FIG. 8 is a circuit diagram illustrating a configuration of the lock signal output unit in FIG. 7.

FIG. 8 is a circuit diagram illustrating a configuration of the lock signal output unit 240 in FIG. 7.

Referring to FIG. 8, the lock signal output unit 240 includes a first inverter 241, a first D flip-flop 242, a second D flip-flop 243, a second inverter 244, a NAND gate 245 and a third inverter 246.

The first inverter 241 inverts the fifth delay signal D5 to provide the inverted fifth delay signal D5 as a clock signal of the first D flip-flop 242.

The first D flip-flop 242 is activated when a reset of the first D flip-flop is cleared in response to the lock preparation signal LOCK_READY outputted from the lock detection unit 220. The first D flip-flop 242 locks the reference signal FREF to a clock signal to output the locked reference signal FREF, in which the inverted signal of the fifth delay signal D5 is used as the clock signal.

The second D flip-flop 243 is activated when a reset of the second D flip-flop is cleared in response to the lock preparation signal LOCK_READY outputted from the lock detector 220. The second D flip-flop 243 locks the reference signal FREF to a clock signal to output the locked reference signal FREF, in which the fifth delay signal D5 is used as the clock signal.

The second inverter 244 inverts a signal outputted from the second D flip-flop 243 to provide the inverted signal to a NAND gate 245.

The NAND gate 245 receives an output signal of the first D flip-flop 242 and an output signal of the second inverter 244, that is, an inverted signal of the output signal from the second D flip-flop. The NAND gate 245 performs a NAND operation on the received signals to output the NAND operation result to the third inverter 246.

The third inverter 246 inverts an output signal of the NAND gate 245 to output the lock signal LOCK.

As described above, the lock state of the DLL 1000 may be stably detected by the lock detector 200 capable of determining an abnormal operation of the input signal.

Figures 9, 10:
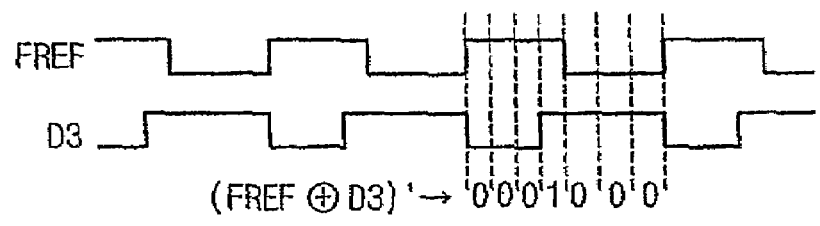
FIG. 9 is a timing diagram illustrating the operation of the lock detector during the lock state section in FIG. 7.
FIG. 10 is a table illustrating results of an exclusive-NOR (XNOR) operation by a charge control signal generation unit and results of an exclusive-OR (XOR) operation by an unlock signal generation unit.

FIG. 9 is a timing diagram illustrating the operation of the lock detector 200 during the lock state section in FIG. 7.

The charge control signal FILTER_IN is generated through an XNOR operation on the reference signal FREF and the third delay signal D3 by the charge control signal generation unit 227. In addition, the unlock control signal UNLOCK is generated through an XOR operation on the reference signal FREF and the seventh delay signal D7 by the unlock signal generation unit 228.

FIG. 10 is a table illustrating results of an XNOR operation by the charge control signal generation unit 227 and results of the XOR operation by the unlock signal generation unit 228.

Referring to FIG. 10, when the logic levels of two input values X and Y are identical, the result of the XNOR operation is '1' (i.e., the high level), and when the logic levels of the two input values X and Y are different, the result of the XNOR operation is '0' (i.e., the low level). On the contrary, the result of the XOR operation is '0' when the logic levels of the two input values X and Y are identical and otherwise, the result of the XOR operation is '1'.

Referring back to FIG. 9, a charge current is generated by the charge control signal FILTER_IN for a term six times longer than a discharge current per period in the lock state section. That is, in the lock detector 220, the charge control unit 221 performs a charge operation on the charge unit 224 when the charge control signal FILTER_IN is '0' (i.e., the low level), and the discharge unit 222 performs a discharge operation when the charge control signal FILTER_IN is '1' (i.e., the high level).

Therefore, a charge amount during one period may be represented by the following Equation 1, where TD is a unit time, that is, time interval between the two adjacent delay signals.

$$6 \times IUP \times TD - 1 \times IDN \times TD = 5 \times IUP \times TD \quad \text{[Equation 1]}$$

In addition, a discharge amount during one period may be represented by the following Equation 2, where the discharge amount is determined by the reference signal FREF and the seventh delay signal D7.

$$0 \times IUNLOCK \times TD = 0 \quad \text{[Equation 2]}$$

(IUNLOCK=7×IUP)

Therefore, a Net Charge Amount During One Period in the Lock State is '5×IUP×TD', which is equal to a value of Equation 2 subtracted from Equation 1. Therefore, the charge unit 224 is charged, and a voltage of the lock decision node LD is increased.

When the lock detector 200 is not in the lock state, a charge amount by the charge control signal FILTER_IN is '5×IUP× TD' and a discharge amount by the unlock signal UNLOCK is at least '7×IUP×TD'. Therefore, when the lock detector 200 does not completely transition into the lock state, a voltage of the lock decision node LD is not increased. A more detailed operation will be described with respect to FIGS. 12 and 13.

Figure 11:
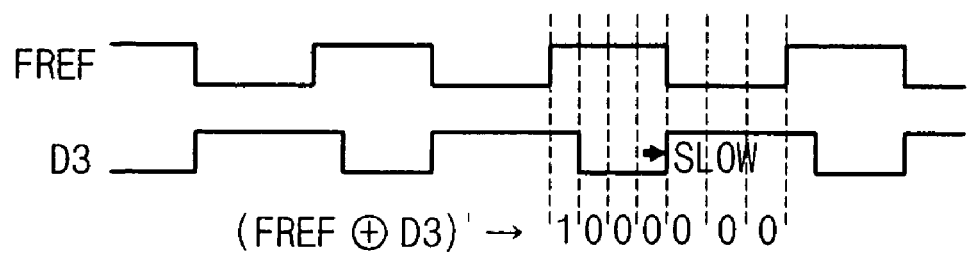
FIG. 11 is a timing diagram illustrating the operation of the lock detector during a slow section.
Figure 11:
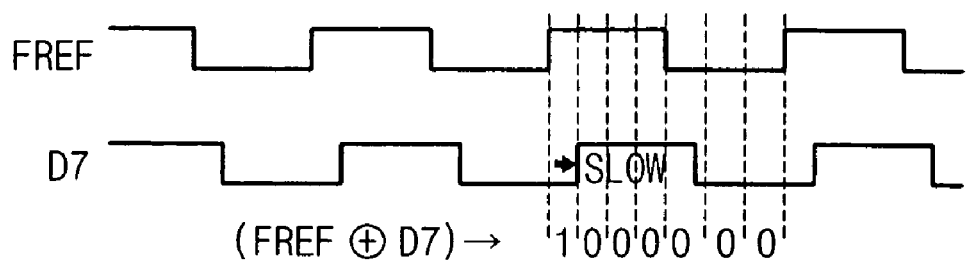

FIG. 11 is a timing diagram illustrating the operation of the lock detector 220 in a slow state.

Referring to FIG. 11, a charge amount during one period in the slow state satisfies the following Equation 3.

$$6 \times IUP \times TD - 1 \times IDN \times TD = 5 \times IUP \times TD \quad \text{[Equation 3]}$$

Additionally, a discharge amount during one period in the slow state satisfies the following Equation 4.

$$1 \times IUNLOCK \times TD = 1 \times 7 \times IUP \times TD \quad \text{[Equation 4]}$$

Therefore, a net charge amount during one period in the slow section is '−2×IUP×TD', which is substantially equal to a value of Equation 4 subtracted from Equation 3. Therefore, a voltage of the lock decision node LD is decreased because the charge unit 224 is discharged.

As illustrated in FIGS. 9, 10 and 11, when the voltage of the lock decision node LD is increased up to a lock voltage HIV, the lock preparation signal LOCK_READY is outputted by the lock preparation signal output unit 225, and requisites for the lock state are satisfied.

However, when the preceding control circuit stops providing a control signal or the input signal FIN (that is, the reference signal FREF) is stopped due to an abnormal operation, a circuit, which detects an abnormal input to make the lock detector 200 output low, is required. Therefore, a function block that detects an abnormality of the input signal FIN is required. As described above, the lock signal output unit 240 is provided to convert an output of the lock detector 200 into a low level when the input signal FIN is abnormal.

Figure 12:
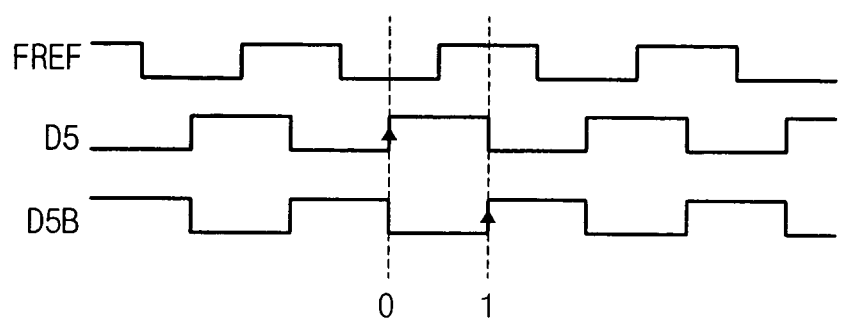
FIG. 12 is a timing diagram illustrating the operation of the lock detector when a normal reference signal is inputted.
Figure 13:
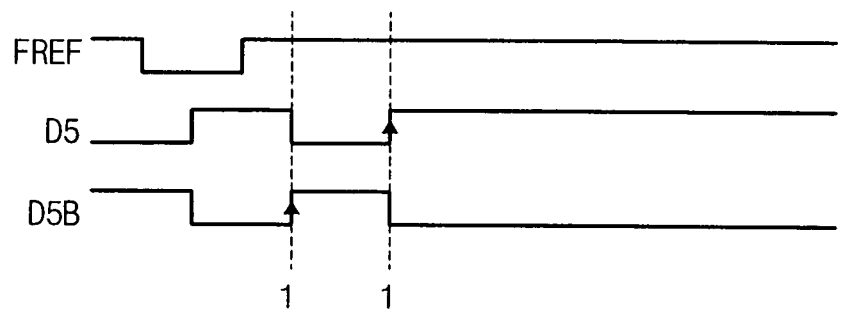
FIG. 13 is a timing diagram illustrating the operation of the lock detector when an abnormal reference signal is inputted.
Figure 14:
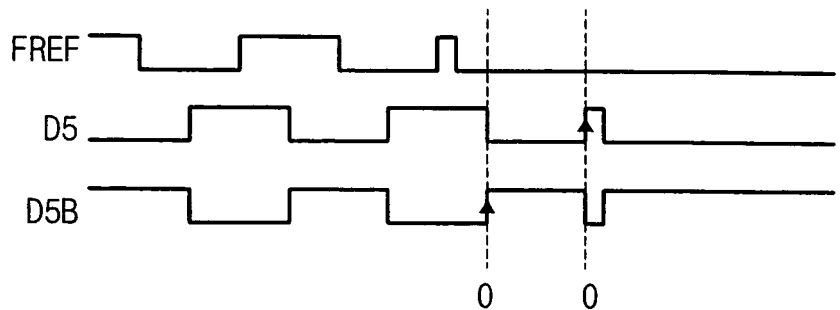
FIG. 14 is a timing diagram illustrating the operation of the lock detector when an abnormal reference signal is inputted.

FIG. 12 is a timing diagram illustrating the operation of the lock detector 220 when a normal reference signal is inputted. FIGS. 13 and 14 are timing diagrams illustrating the operation of the lock detector 220 when an abnormal reference signal is inputted.

Referring to FIGS. 8 and 12, when requisites for the lock state are satisfied and the lock preparation signal LOCK_READY is inputted, a reset of the first D flip-flop 242 and the second D flip-flop 243 is cleared and the first D flip-flop 242 and the second D flip-flop 243 are activated.

When the reference signal FREF is normal, the fifth delay signal D5 and the inverted fifth delay signal D5B have waveforms as illustrated in FIG. 12. Therefore, since the second D flip-flop 243, which receives the fifth delay signal D5 as a clock signal, samples a value '0' through a rising edge, and the first D flip-flop 242, which receives the inverted fifth delay signal D5B, samples a value '1' through a rising edge, the lock signal LOCK finally becomes a high level.

However, when the input signal FIN (that is, the reference signal FREF) is changed into an abnormal state (for example, the reference signal FREF is fixed to a high level signal as illustrated in FIG. 13 or a low level signal as illustrated in FIG. 14), a condition for a high level of the lock signal LOCK, which is outputted from the lock signal output unit 240 is not satisfied. Consequently, the lock signal LOCK transitions into a low level, and the low level of the lock signal indicates that DLL 1000 does not hold the lock state.

As described above, the lock detector 200 according to example embodiments of the present invention detects the lock state of the DLL while an output signal of the DLL is in a stable state by using analog charge and discharge operations based on the delay signals outputted from the respective unit delay cells of the VCDL 140. Therefore, the lock detector 200 may decrease noise influence and may stably detect the lock state. Additionally, the lock detector 200 may detect an abnormality of the input signal to reflect the abnormality of the input signal to detection of the lock state.

While the present invention has been particularly shown and described with reference to exemplary embodiments thereof, it will be understood by those of ordinary skill in the art that various changes in form and details may be made therein without departing from the spirit and scope of the present invention as defined by the following claims.

For example, it is understood that the number of the delay cell in the VCDL 140 may be increased or decreased depending on design necessities. Such variations are not to be regarded as a departure from the spirit and scope of example embodiments of the present invention, and all such modifications as would be obvious to one skilled in the art are intended to be included within the scope of the following claims.

What is claimed is:

1. A lock detector of a delay-locked loop (DLL), comprising:
    a lock detection unit that generates a charge control signal based on a reference signal received from an external source and a plurality of delay signals received from an external voltage-controlled delay line (VCDL), wherein the lock detection unit controls a charge current based on the charge control signal, and wherein the lock detection unit detects a lock state of the DLL based on a voltage that varies depending on the charge current, the charge current including first and second currents; and
    a bias unit configured to provide a bias voltage for controlling a magnitude of the charge current.

2. The lock detector of claim 1, wherein the delay signals comprise at least one of a first delay signal, a second delay signal, a third delay signal, a fourth delay signal, a fifth delay signal, a sixth delay signal and a seventh delay signal, the delay signals being sequentially outputted from seven unit delay cells of the VCDL, and wherein the lock detection unit receives the third delay signal, the fifth delay signal, and the seventh delay signal.

3. The lock detector of claim 2, wherein the lock detection unit comprises:
    a charge unit configured to provide the voltage that varies depending on the charge current;
    a charge control signal generation unit configured to generate the charge control signal based on the reference signal and the third delay signal;
    a charge control unit configured to generate the first current for charging the charge unit by a unit time, in response to the charge control signal generated by the charge control signal generation unit;

a discharge control unit configured to generate the second current for discharging the charge unit by the unit time, in response to the charge control signal generated by the charge control signal generation unit; and a lock preparation signal output unit configured to output a lock preparation signal when the lock state is detected.

4. The lock detector of claim 3, wherein the charge control signal generation unit includes an exclusive-NOR (XNOR) gate that receives the reference signal and the third delay signal.

5. The lock detector of claim 3, wherein the charge control signal is at a high level when logic levels of the reference signal and the third delay signal are identical, and the charge control signal is at a low level when the logic levels of the reference signal and the third delay signal are different.

6. The lock detector of claim 3, wherein the charge control unit and the discharge control unit are coupled in series between a power voltage and a ground terminal, and the charge control unit is coupled to a lock decision node, the lock decision node being a linkage point between the charge control unit and the discharge control unit.

7. The lock detector of claim 6, wherein the charge control unit comprises:

a charge control metal-oxide semiconductor (MOS) transistor coupled to the power voltage, and configured to be turned on in response to the charge control signal; and a first bias MOS transistor coupled in series between the charge control MOS transistor and the lock decision node, and configured to generate the first current based on the bias voltage provided by the bias unit.

8. The lock detector of claim 6, wherein the discharge control unit comprises:

a discharge control MOS transistor coupled to the ground terminal, and configured to be turned on in response to the charge control signal; and a second bias MOS transistor coupled in series between the discharge control MOS transistor and the lock decision node, and configured to generate the second current based on the bias voltage provided by the bias unit.

9. The lock detector of claim 3, wherein magnitudes of the first current and the second current are substantially the same.

10. The lock detector of claim 3, wherein the unit time is a time interval between the two adjacent delay signals.

11. The lock detector of claim 10, wherein the unit time is about one-seventh of a period of the reference signal.

12. The lock detector of claim 3, wherein the charge unit includes a capacitor.

13. The lock detector of claim 3, wherein the lock preparation signal output unit outputs the lock preparation signal when a voltage of the lock decision node is increased by the charge current up to a lock voltage.

14. The lock detector of claim 3, wherein the lock preparation output unit is a Schmitt trigger circuit that is insensitive to noise.

15. The lock detector of claim 3, wherein the lock detection unit further comprises:

an unlock signal generation unit configured to generate an unlock signal based on the reference signal and the seventh delay signal; and an unlock control unit configured to generate a third current for discharging the charge unit by the unit time, in response to the unlock signal generated by the unlock signal generation unit.

16. The lock detector of claim 15, wherein the unlock signal is at a low level when logic levels of the reference signal and the seventh delay signal are identical, and the unlock signal is at a high level when the logic levels of the reference signal and the seventh delay signal are different.

17. The lock detector of claim 15, wherein the unlock signal generation unit includes an exclusive-OR (XOR) gate that receives the reference signal and the seventh delay signal.

18. The lock detector of claim 15, wherein a magnitude of the third current is about seven times that of the first current.

19. The lock detector of claim 15, wherein the unlock control unit comprises:

an unlock control MOS transistor coupled to the ground terminal, and configured to be turned on in response to the unlock signal; and a third bias MOS transistor coupled in series between the lock decision node and the unlock control MOS transistor, and configured to generate the third current for discharging the charge unit based on the bias voltage provided by the bias unit.

20. The lock detector of claim 1, further comprising:

a lock signal output unit that is activated in response to a lock preparation signal provided from the lock detection unit, wherein the lock signal output unit determines whether or not the reference signal is abnormal based on the reference signal and at least one of the delay signals, and wherein the lock signal output unit outputs a lock signal when the reference signal is normal, the lock signal indicating that the DLL is in the lock state.

21. The lock detector of claim 20, wherein the lock signal output unit determines whether or not the reference signal is abnormal based on the reference signal and the fifth delay signal.

22. The lock detector of claim 21, wherein the lock signal output unit comprises:

a first inverter configured to invert the fifth delay signal;

a first D flip-flop configured to be activated when a reset of the first D flip-flop is cleared by the lock preparation signal outputted from the lock detection unit, and configured to lock the reference signal to a first clock signal to output the locked reference signal, the first clock signal being an output signal of the first inverter;

a second D flip-flop configured to be activated when a reset of the second D flip-flop is cleared by the lock preparation signal, and configured to lock the reference signal to a second clock signal to output the locked reference signal, the second clock signal being the fifth delay signal;

a second inverter configured to invert an output signal of the second D flip-flop;

a NAND gate configured to receive an output signal of the first D flip-flop and an output signal of the second inverter to perform a NAND operation on the output signal of the first D flip-flop and the output of the second inverter; and a third inverter configured to invert an output signal of the NAND gate to output the lock signal.

23. A delay-locked loop (DLL), comprising:

a phase detector configured to compare a reference signal with a feedback signal to generate an up signal or a down signal, the reference signal corresponding to an input signal provided from an external source, the feedback signal corresponding to an output signal of the DLL;

a charge pump configured to generate a current signal that varies based on the up signal and the down signal outputted from the phase detector;

a loop filter configured to generate a control voltage signal;

a voltage-controlled delay line (VCDL) configured to delay the reference signal in response to the control voltage signal outputted from the loop filter, the VCDL having a plurality of unit delay cells that are coupled in series and sequentially generate delay signals; and a lock detector configured to detect a lock state of an output signal from the VCDL based on the reference signal and the delay signals outputted from the VCDL, wherein the lock detector controls a charge current based on a charge control signal, and detects the lock state based on a voltage that varies depending on the charge current.

24. The DLL of claim 23, wherein the lock detector comprises:

a lock detection unit configured to generate the charge control signal based on the reference signal and the delay signals, configured to control the charge current based on the charge control signal, and configured to detect the lock state based on the voltage that varies depending on the charge current, the charge current including first and second currents; and a bias unit configured to provide a bias voltage for controlling a magnitude of the charge current.

25. The DLL of claim 24, wherein the VCDL comprises a first unit delay cell, a second unit delay cell, a third unit delay cell, a fourth unit delay cell, a fifth unit delay cell, a sixth unit delay cell and a seventh unit delay cell, the first through seventh unit delay cells being coupled in series.

26. The DLL of claim 25, wherein the delay signals comprise at least one of a first delay signal outputted from the first unit delay cell, a second delay signal outputted from the second unit delay cell, a third delay signal outputted from the third unit delay cell, a fourth delay signal outputted from the fourth unit delay cell, a fifth delay signal outputted from the fifth unit delay cell, a sixth delay signal outputted from the sixth unit delay cell and a seventh delay signal outputted from the seventh unit delay cell, and wherein the lock detection unit receives the third delay signal, the fifth delay signal, and the seventh delay signal.

27. The DLL of claim 26, wherein the lock detection unit comprises:

a charge unit configured to provide the voltage that varies depending on the charge current;

a charge control signal generation unit configured to generate the charge control signal based on the reference signal and the third delay signal;

a charge control unit configured to generate the first current for charging the charge unit by a unit time, in response to the charge control signal generated by the charge control signal generation unit;

a discharge control unit configured to generate the second current for discharging the charge unit by the unit time, in response to the charge control signal generated by the charge control signal generation unit; and a lock preparation signal output unit configured to output a lock preparation signal when the lock state is detected.

28. The DLL of claim 27, wherein the charge control signal generation unit includes an exclusive-NOR (XNOR) gate that receives the reference signal and the third delay signal.

29. The DLL of claim 27, wherein the charge control signal is a high level when logic levels of the reference signal and the third delay signal are identical, and the charge control signal is a low level when the logic levels of the reference signal and the third delay signal are different.

30. The DLL of claim 27, wherein the charge control unit and the discharge control unit are coupled in series between a power voltage and a ground terminal, and the charge control unit is coupled to a lock decision node, the lock decision node being a linkage point between the charge control unit and the discharge control unit.

31. The DLL of claim 30, wherein the charge control unit comprises:

a charge control metal-oxide semiconductor (MOS) transistor coupled to the power voltage, and configured to be turned on in response to the inverted charge control signal; and a first bias MOS transistor coupled in series between the charge control MOS transistor and the lock decision node, and configured to generate the first current based on the bias voltage provided by the bias unit.

32. The DLL of claim 30, wherein the discharge control unit comprises:

a discharge control MOS transistor coupled to the ground terminal, and configured to be turned on in response to the charge control signal; and a second bias MOS transistor coupled in series between the discharge control MOS transistor and the lock decision node, and configured to generate the second current based on the bias voltage provided by the bias unit.

33. The DLL of claim 27, wherein magnitudes of the first current and the second current are substantially the same.

34. The DLL of claim 27, wherein the unit time is a time interval between the two adjacent delay signals.

35. The DLL of claim 34, wherein the unit time is about one-seventh of a period of the reference signal.

36. The DLL of claim 27, wherein the charge unit includes a capacitor.

37. The DLL of claim 27, wherein the lock preparation signal output unit outputs the lock preparation signal when a voltage of the lock decision node is increased by the charge current up to a lock voltage.

38. The DLL of claim 27, wherein the lock preparation output unit is a Schmitt trigger circuit that is insensitive to noise.

39. The DLL of claim 27, wherein the lock detection unit comprises:

an unlock signal generation unit configured to generate an unlock signal based on the reference signal and the seventh delay signal; and an unlock control unit coupled to the lock decision node, and configured to generate a third current for discharging the charge unit by the unit time, in response to the unlock signal generated by the unlock signal generation unit.

40. The DLL of claim 39, wherein the unlock signal is a low level when logic levels of the reference signal and the seventh delay signal are identical, and the unlock signal is a high level when the logic levels of the reference signal and the seventh delay signal are different.

41. The DLL of claim 39, wherein the unlock signal generation unit includes an exclusive-OR (XOR) gate that receives the reference signal and the seventh delay signal.

42. The DLL of claim 39, wherein a magnitude of the third current is about seven times that of the first current.

43. The DLL of claim 39, wherein the unlock control unit comprises:

an unlock control MOS transistor coupled to the ground terminal, and configured to be turned on in response to the unlock signal; and a third bias MOS transistor coupled in series between the lock decision node and the unlock control MOS transistor, and configured to generate the third current for discharging the charge unit based on the bias voltage provided by the bias unit.

44. The DLL of claim 24, wherein the lock detector further comprising:

a lock signal output unit configured to be activated in response to a lock preparation signal provided from the lock detection unit, configured to determine whether or not the reference signal is abnormal based on the reference signal and at least one of the delay signals, and configured to output a lock signal when the reference signal is normal, the lock signal indicating that the DLL is in the lock state.

45. The DLL of claim 44, wherein the lock signal output unit determines whether or not the reference signal is abnormal based on the reference signal and the fifth delay signal.

46. The DLL of claim 45, wherein the lock signal output unit comprises:

a first inverter configured to invert the fifth delay signal;

a first D flip-flop configured to be activated when a reset of the first D flip-flop is cleared by the lock preparation signal outputted from the lock detection unit, and configured to lock the reference signal to a first clock signal to output the locked reference signal, the first clock signal being an output signal of the first inverter;

a second D flip-flop configured to be activated when a reset of the second D flip-flop is cleared by the lock preparation signal, and configured to lock the reference signal to a second clock signal to output the locked reference signal, the second clock signal being the fifth delay signal;

a second inverter configured to invert an output signal of the second D flip-flop;

a NAND gate configured to receive an output signal of the first D flip-flop and an output signal of the second inverter to perform a NAND operation on the output signal of the first D flip-flop and the output of the second inverter; and a third inverter configured to invert an output signal of the NAND gate to output the lock signal.

* * * * *